US010692977B2

(12) United States Patent
Withers et al.

(10) Patent No.: US 10,692,977 B2
(45) Date of Patent: Jun. 23, 2020

(54) HETEROSTRUCTURES AND ELECTRONIC DEVICES DERIVED THEREFROM

(71) Applicant: Nanoco Technologies Ltd., Manchester (GB)

(72) Inventors: Frederick Withers, Manchester (GB); Konstantin Novoselov, Manchester (GB)

(73) Assignee: Nanoco Technologies Ltd., Manchester (GB)

( * ) Notice: Subject to any disclaimer, the term of this patent is extended or adjusted under 35 U.S.C. 154(b) by 0 days.

(21) Appl. No.: 15/737,158

(22) PCT Filed: Jun. 18, 2015

(86) PCT No.: PCT/GB2015/051784
§ 371 (c)(1),
(2) Date: Dec. 15, 2017

(87) PCT Pub. No.: WO2016/203184
PCT Pub. Date: Dec. 22, 2016

(65) Prior Publication Data
US 2018/0158913 A1   Jun. 7, 2018

(51) Int. Cl.
*H01L 29/15* (2006.01)
*H01L 29/267* (2006.01)
(Continued)

(52) U.S. Cl.
CPC .......... *H01L 29/152* (2013.01); *H01L 29/267* (2013.01); *H01L 33/06* (2013.01);
(Continued)

(58) Field of Classification Search
CPC ..... H01L 29/152; H01L 29/267; H01L 29/24; H01L 29/413; H01L 33/06; H01L 33/26;
(Continued)

(56) References Cited

U.S. PATENT DOCUMENTS 9,548,364 B2    1/2017   Geim et al.
2015/0083206 A1  3/2015  Novoselov et al.

FOREIGN PATENT DOCUMENTS

WO    2012127244 A2    9/2012

OTHER PUBLICATIONS

Fengnian Xia, Han Wang, Di Xiao, Madan Dubey & Ashwin Ramasubramaniam, Two-dimensional Material Nanophotonics, Nature Photonics vol. 8, pp. 899-907 (2014) (Year: 2014).*
Xiaomu Wang & Fengnian Xia, Stacked 2D materials shed light, Nature Materials vol. 14, pp. 264-265 (2015) ("Wang") (Year: 2015).*
F. Withers, O. Del Pozo-Zamudio, A. Mishchenko, A. P. Rooney, A. Gholinia, K. Watanabe, T. Taniguchi, S. J. Haigh, A. K. Geim, A . I. Tartakovskii & K. S. Novoselov, Light-emitting diodes by band-structure engineering in van der Waals heterostructures, Nature Materials vol. 14, pp. 301-306 (2015) (Year: 2015).*
(Continued)

*Primary Examiner* — Mark W Tornow
(74) *Attorney, Agent, or Firm* — Blank Rome, LLP

(57) ABSTRACT

The advent of graphene and related 2D materials has recently led to a new technology: heterostructures based on these atomically thin crystals. The paradigm proved itself extremely versatile and led to rapid demonstration of tunnelling diodes with negative differential resistance, tunnelling transistors, photovoltaic devices and so on. In the present invention, the complexity and functionality of such van der Waals heterostructures is taken to the next level by introducing quantum wells (QWs) engineered with one atomic plane precision. We describe light-emitting diodes (LEDs) made by stacking metallic graphene, insulating hexagonal boron nitride and various semiconducting monolayers into complex but carefully designed sequences.

16 Claims, 8 Drawing Sheets

(51) Int. Cl.

| | | |
|---|---|---|
| *H05B 33/14* | (2006.01) | |
| *H05B 33/20* | (2006.01) | |
| *H05B 33/26* | (2006.01) | |
| *H01L 33/06* | (2010.01) | |
| *H01L 33/26* | (2010.01) | |
| *H01L 29/16* | (2006.01) | |
| *H01L 29/24* | (2006.01) | |
| *H01L 33/32* | (2010.01) | |
| *H01L 29/41* | (2006.01) | |
| *H01L 33/34* | (2010.01) | |

(52) U.S. Cl.
CPC ........... *H01L 33/26* (2013.01); *H05B 33/145* (2013.01); *H05B 33/20* (2013.01); *H05B 33/26* (2013.01); *H01L 29/1606* (2013.01); *H01L 29/24* (2013.01); *H01L 29/413* (2013.01); *H01L 33/32* (2013.01); *H01L 33/34* (2013.01)

(58) Field of Classification Search
CPC ....... H01L 33/32; H01L 33/34; H05B 33/145; H05B 33/20; H05B 33/26
See application file for complete search history.

(56) References Cited

OTHER PUBLICATIONS

Woo Jong Yu, Yuan Liu, Hailong Zhou, Anxiang Yin, Zheng Li, Yu Huang & Xiangfeng Duan, Highly efficient gate-tunable photocurrent generation in vertical heterostructures of layered materials, Nature Nanotechnology vol. 8, pp. 952-958 (2013) (Year: 2013).*

International Search Report and The Written Opinion of the International Searching Authority, dated Apr. 29, 2016, 16 pages.

Bae, S., et al., (2010), "Roll-to-roll production of 30-inch graphene films for transparent electrodes", Nature Nanotechnology, vol. 5, pp. 574-578.

Britnell, L., et al., (2013), "Strong Light-Matter Interactions in Heterostructures of Atomically This Films", Science, vol. 340, pp. 1311-1314.

Liang, Y.T., et al., (2012), "Towards Rationally Designed Graphene-Based Materials and Devices", Macromolecular Chemistry and Physics, vol. 213, pp. 1091-1100.

Novoselov, K.S., et al., (2004), "Electric Field Effect in Atomically Thin Carbon Films", Science, vol. 306, No. 5696, pp. 666-669.

Wang, X., et al., (2015), "Stacked 2D Materials Shed Light", Natura Materials, vol. 14, pp. 264-265.

Withers, F., et al., (2015), "Light-emitting diodes by band-structure engineering in van der Waals heterostructures", Nature Materials, vol. 14, pp. 301-306.

* cited by examiner

HETEROSTRUCTURES AND ELECTRONIC DEVICES DERIVED THEREFROM

CROSS REFERENCE TO RELATED APPLCIATION

This application is a national stage of International Patent Application No. PCT/GB2015/051784, filed Jun. 18, 2015, the entire contents of which are incorporated herein by reference.

FIELD OF THE INVENTION

The advent of graphene and related 2D materials has recently led to a new technology: heterostructures based on these atomically thin crystals. The paradigm proved itself extremely versatile and led to rapid demonstration of tunnelling diodes with negative differential resistance, tunnelling transistors, photovoltaic devices and so on.

In the present invention, the complexity and functionality of such van der Waals heterostructures is taken to the next level by introducing quantum wells (QWs) engineered with one atomic plane precision. We describe light-emitting diodes (LEDs) made by stacking metallic graphene, insulating hexagonal boron nitride and various semiconducting monolayers into complex but carefully designed sequences.

This invention thus relates to vertical heterostructures and devices derived from such structures such as light emitting diodes (LEDs). Specifically the heterostructure comprises a laminate structure containing layers of graphene, layers of an insulator and layers of a semiconductor material which are disposed so as to form either a single quantum well or a series of quantum wells which are stacked in a heterostructure. The semiconductor material is a transition metal dichalcogenide which is provided in one or more layers in a vertical heterostructure. The graphene may be graphene itself or may be modified graphene in which graphene has been chemically and or physically modified in order to alter its electronic properties.

The first devices already exhibit an extrinsic quantum efficiency of nearly 10% and the emission can be tuned over a wide range of frequencies by appropriately choosing and combining 2D semiconductors (monolayers of transition metal dichalcogenides).

By preparing the heterostructures on elastic and/or transparent substrates, they can also provide the basis for flexible and/or semi-transparent electronics. The range of functionalities for the demonstrated heterostructures is expected to grow further on increasing the number of available 2D crystals and improving their electronic quality.

BACKGROUND

Graphene is a two-dimensional allotrope of carbon, in which a planar sheet of $sp^2$ hybridised carbon atoms is arranged in a 'honeycomb pattern' of tessellated hexagons. Essentially graphene is a single layer of graphite. Graphene is a semi metal with high room temperature charge carrier mobility. It is stable in ambient conditions and its electronic properties can be controlled through application of an electric field as with traditional silicon transistors (K. S. Novoselov, A. K. Geim, S. V. Morozov, D. Jiang, Y. Zhang, S. V. Dubonos, I. V. Grigorieva and A. A. Firsov, "Electric field Effect in Atomically Thin Carbon Films"*Science*, Vol. 306, No. 5696, pp. 666-669, 2004).

The advent of graphene and subsequent discovery of its multitude of superior properties, has led to the identification of many other two-dimensional crystals through both chemical modification of graphene and exfoliation of other layered compounds. Other two dimensional materials which have been isolated include $NbSe_2$, bismuth strontium calcium copper oxide (BSCCO) and $MoS_2$. These are also stable and can exhibit complementary electronic properties to graphene, such as being insulators, semiconductors or superconductors.

Graphene's properties are typically encumbered by its proximity to most substrates. Although it is possible to suspend graphene, this is technologically unfavourable due to the fragile nature of these devices. However, boron nitride (BN); a two-dimensional layered material which is a good insulator) provides a good substrate which has a much smaller effect on graphene's properties than previously reported materials. This is manifest in the increase in electron mobility and decrease in charge inhomogeneity of graphene. It has also become possible to achieve very clean and precise transfer of thin crystal flakes to the surfaces of one another and devices can be prepared which involve two electrically isolated graphene layers.

This new area of research and progress in precise transferring of the crystals whilst maintaining their quality has resulted in the emergence of a new class of materials: two-dimensional-crystal based heterostructures. More specifically, there is the possibility to create hybrid materials, by stacking combinations of two-dimensional crystals with differing properties. These structures are interesting from both a fundamental and an application based point of view. It has, for instance, been shown that a trilayer stack of graphene/boron nitride/graphene is operable as a tunnelling transistor. This means that the size of the barrier (BN) for electrons to flow between the two separate graphene layers can be varied by a gate electrode. These tunnelling devices are intrinsically fast and may be suitable for high frequency applications. The on/off ratio was enhanced by replacing the boron nitride layer with that of a material with a smaller band gap such as $MoS_2$.

As well as allowing the operation of tunnelling transistors, this layering of sheets of graphene and boron nitride or molybdenum disulfide has permitted the observation of phenomena such as Coulomb drag. Coulomb drag is where the flow of electrons in one graphene layer of the graphene/BN/graphene heterostructures were observed to 'drag' along electrons in the other layer. These effects have previously been seen in GaAlAs heterostructures but in the case of graphene-based heterostructures an important feature is the ability to make the separation so small that electrons are closer to their counterparts in the other layer than within their own layer. There is also the possibility to tune between electrons and holes, which is not possible in conventional semiconductors.

Graphene can now be synthesised and transferred onto a substrate with roll-to-roll processing, enabling the possibility of industrial production of devices such as touch screens (S Bae, H. Kim, X. Xu, J.-S. Park. Y Zheng, J. Balakrishnan, T. Lei, H. R. Kim, Y. I. Song. Y-J. Kim. K. S. Kim, B. Özyilmaz, J.-H. Ahn, S. ljima Roll-to-roll production of 30-inch graphene films for transparent electrodes; *Nature Nanotechnology*, 5, 574-578, 2010).

Graphene is also intrinsically very strong. It has been found to be one of the strongest materials ever measured. This means that graphene is inherently able to withstand large deformation forces. Combined with graphene's ability to elastically stretch up to 20% this makes it suitable for flexible electronic applications. This is likely to be particularly important in the field of display technologies and opens the way to flexible displays based on graphene. Such materials may find utility in a number of hand-held and small portable devices in which a flexible display would be advantageous.

Transition metal dichalcogenides (TMDCs) are a group of layered materials that have been found to exfoliate to monolayer by both mechanical and chemical methods. Many of these various materials—$MoS_2$, $WS_2$, $TaS_2$ to name a few—are structurally similar but have an array of electronic properties ranging from semiconducting to metallic depending on their exact composition and thickness. Tungsten disulfide ($WS_2$) has various applications including solid state lubrication and industrial surface protection.

It is an aim of certain embodiments of the present invention to provide a heterostructure containing quantum wells. A further aim is to provide a vertical heterostructure. In certain embodiments it is an aim to produce multiple quantum well (MQW) devices which are easier to fabricate and/or have improved properties relative to conventional quantum well (QW) structures. Another aim of the invention is to provide a novel single quantum well (SQW) heterostructure. It is also an aim of certain embodiments to provide a heterostructure having a high electroluminescent quantum efficiency relative to currently available materials. It is a further aim of certain embodiments of the invention to provide a vertical heterostructure capable of incorporation into an electronic device such as an LED. It is an aim to provide a device having a quantum efficiency which is sufficient to produce a viable LED device. A further aim of the invention is to prepare LEDs having a higher quantum efficiency and/or which are capable of emitting a broader range of visible radiation compared with current LEDs.

It is a further aim of embodiments of the invention to provide a device which converts a higher percentage of the input energy into visible or near infra red radiation than those of the prior art. In other words it is an aim to provide a cell or device which has a higher energy conversion efficiency than those of the prior art. Yet another aim is to provide a heterostructure or an electronic device incorporating such a heterostructure which is more robust and/or more flexible and/or which has a greater longevity than those of the prior art.

This invention generally relates to new applications of graphene. Specifically, the invention relates to new graphene heterostructures, applications of graphene heterostructures and methods of making graphene heterostructures.

It is an aim of the invention to provide methods of making graphene heterostructures which are more energy efficient than existing methods. The methods may be quicker than existing methods. They may generate less waste than existing methods.

It is an aim of this invention to provide methods which allow access to graphene heterostructures which it is not possible to make using existing methods.

It is an aim of this invention to provide methods which allow the efficient production of graphene heterostructures on a larger scale than existing methods.

A further aim of the invention is the provision of new graphene heterostructures.

These heterostructures may have similar properties to existing graphene heterostructures but be easier to produce. The new graphene heterostructures may have improved properties compared to known graphene heterostructures, or they may have improved properties compared to known non-graphene based materials. The graphene heterostructures may have new properties not previously observed in graphene heterostructures. In particular, the new heterostructures may have new combinations of properties not previously observed in a single material, whether that material is graphene based or not graphene based.

Another aim of the invention is to provide heterostructures for use in new photonics devices, such as LEDs. Further advantages and aims of the invention will be apparent from the following description.

Embodiments of the following invention may achieve at least one of the above aims.

BRIEF SUMMARY OF THE DISCLOSURE

In accordance with a first aspect of the invention, there is provided a graphene-based vertical heterostructure comprising at least two graphene layers, at least one insulating layer and at least two semiconductor layers.

The semiconductor layer in each case may independently be a compound of form MX or $MX_2$ where M is a transition metal, or In or Ga, and where X is a chalcogen.

Usually, at least one of the graphene layers is always separated from a semiconductor layer by at least one insulating layer. In an embodiment, all (e.g. both) graphene layers are separated from any semiconductor layer by at least one (and usually one) insulating layer. The layers of semiconductor are normally separated from one another by an insulating layer. In a structure having multiple semiconductor layers, the intervening insulating layers may be the same or different. Similarly the intervening insulating layers may be the same thickness or have a different thickness. Preferably, the thickness of intervening insulating layers is the same.

In an embodiment of this first aspect of the invention, the heterostructure may form a component part of a larger heterostructure. Thus, one or more additional layers may be present on top of the first graphene layer. Independently, one or more additional layers may be present on top of the second graphene layer. The additional layers may on each occasion be independently selected from hBN, SiO2 and Si.

The heterostructure may be mounted on a substrate, such as plastics or metal, or on another structure.

The heterostructures of the present invention are presented in the form of the laminates in which the two-dimensional arrays of the component materials are stacked one on top of another in a sandwich-type structure. The heterostructure of the present invention may in many instances be flexible. Flexible means that shaping the heterostructure (e.g. by bending, rolling or molding it) does not damage the structure or significantly impede the efficiency and light output. This is a significant advantage for the intended applications of the invention since conventional technologies are frequently limited to those in which the heterostructure must be fixed in a plane.

The term "layer" in the context of a heterostructure as a whole (a laminate structure comprising sheets of different material stacked one on top of another) refers to an individual sheet of material of the same composition both in the first and second aspects of the invention. Such a sheet of material is adjacent to another sheet of material of different composition which is considered to represent a separate layer in the heterostructure i.e. a heterojunction is formed between two such adjacent layers within the heterostructure. For layers that are contained within the body of the heterostructure, a heterojunction is formed on either side of the layer with the different materials on either side.

When referring to an individual component of the heterostructure i.e. a single sheet of component material within the laminate in the first and second aspects of the invention, the term "layer" can also be used to describe the number of atomic layers within that material. In the case of a material such as graphene or modified graphene, the term "layer" can then be used to refer to the fact that the graphene may be a monolayer i.e. one atom thick or maybe several layers thick i.e. be, for example, from 2 to 15 atomic layers thick. A similar consideration applies to hBN who structure is analogous to that of graphene or modified graphene. However, in the case of a semiconductor material such as a TMDC, a single crystal of the material is necessarily three atomic layers thick, or multiples thereof, due to the stoichiometry of the material. Each of the sets of three atomic layers which are present in a single crystal of the TMDC can be referred to as a single molecular layer.

In certain embodiments of the invention, one or more component layers of the heterostructure i.e. one or more of the sheets of material forming the heterostructure may be formed of a single crystal. In certain other embodiments, one or more of the component atomic or molecular layers of the heterostructure i.e. sheets of material may comprise a plurality of flakes of the material which are positioned alongside or even slightly overlapping with each other along the plane of the layer. Such a layer is thus a composite of flakes. Thus, for example, in this embodiment it is contemplated that flakes of graphene might be used to produce a graphene layer (in the bulk sense of a sheet) in the heterostructure. This opens up the possibility of forming a printed layer of graphene in the heterostructure which would be advantageous in terms of ease of fabrication and/or cost of manufacture. It is also contemplated that flakes of insulator and/or semiconductor material might be used to produce one or more of the respective bulk layers (sheets) within the heterostructure.

By combining several different 2D crystals in the heterostructures of the present invention one can create a designer potential landscape for electrons to live in. Rendering the band structure with atomic precision allows tunnel barriers, QWs and other structures, based on the broad choice of 2D materials.

Using graphene as a transparent conductive layer, hexagonal boron nitride (hBN) as tunnel barriers and different transition metal dichalcogenides (TMDCs) as the materials for QWs, we can create efficient LEDs. In our devices, electrons and holes are injected into a layer of TMDC from the two graphene electrodes. As a result of the long lifetime of the quasiparticles in the QWs (determined by the height and thickness of the neighbouring hBN barriers), electrons and holes recombine, emitting a photon. The emission wavelength can be fine-tuned by the appropriate selection of TMDC and quantum efficiency (QE) can be enhanced by using multiple QWs (MQWs).

Until now, electroluminescence (EL) in TMDC devices has been reported only for lateral monolayer devices and attributed to thermally assisted processes arising from impact ionization across a Schottky barrier and formation of p-n junctions. The use of vertical heterostructures allows us to improve the performance of LEDs in many respects. These improvements include: reduced contact resistance, higher current densities allowing brighter LEDs, luminescence from the whole device area, and the availability of a wider choice of TMDCs and their combinations when designing such heterostructures.

Thus, in one specific embodiment the heterostructure comprises at least the following layers in sequence:

a first graphene layer comprising graphene or modified graphene;
a first insulating layer (preferably hBN);
a first TMDC layer (preferably $MoS_2$ or $WS_2$ or $WSe_2$);
a second insulating layer (preferably hBN);
a second TMDC layer (preferably $MoS_2$ or $WS_2$ or $WSe_2$);
a third insulating layer (preferably hBN); and
a second graphene layer comprising graphene or modified graphene;
wherein the layers are stacked sequentially in the order described to form a laminate structure.

Thus, in another specific embodiment the heterostructure comprises at least the following layers in sequence:

a first graphene layer comprising graphene or modified graphene;
a first insulating layer (preferably hBN);
a first TMDC layer (preferably $MoS_2$ or $WS_2$ or $WSe_2$);
a second insulating layer (preferably hBN);
a second TMDC layer (preferably $MoS_2$ or $WS_2$ or $WSe_2$);
a third insulating layer (preferably hBN);
a third TMDC layer (preferably $MoS_2$ or $WS_2$ or $WSe_2$);
a fourth insulating layer (preferably hBN); and
a second graphene layer comprising graphene or modified graphene;
wherein the layers are stacked sequentially in the order described to form a laminate structure.

Thus, in another specific embodiment the heterostructure comprises at least the following layers in sequence:

a first graphene layer comprising graphene or modified graphene;
a first insulating layer (preferably hBN);
a first TMDC layer (preferably $MoS_2$ or $WS_2$ or $WSe_2$);
a second insulating layer (preferably hBN);
a second TMDC layer (preferably $MoS_2$ or $WS_2$ or $WSe_2$);
a third insulating layer (preferably hBN);
a third TMDC layer (preferably $MoS_2$ or $WS_2$ or $WSe_2$);
a fourth insulating layer (preferably hBN);
a fourth TMDC layer (preferably $MoS_2$ or $WS_2$ or $WSe_2$);
a fifth insulating layer (preferably hBN); and
a second graphene layer comprising graphene or modified graphene;
wherein the layers are stacked sequentially in the order described to form a laminate structure.

Thus, in another specific embodiment the heterostructure comprises at least the following layers in sequence:

a first graphene layer comprising graphene or modified graphene;
a first insulating layer (preferably hBN);
a first TMDC layer (preferably $MoS_2$ or $WS_2$ or $WSe_2$);
a second insulating layer (preferably hBN);
a second TMDC layer (preferably $MoS_2$ or $WS_2$ or $WSe_2$);
a third insulating layer (preferably hBN);
a third TMDC layer (preferably $MoS_2$ or $WS_2$ or $WSe_2$);
a fourth insulating layer (preferably hBN);
a fourth TMDC layer (preferably $MoS_2$ or $WS_2$ or $WSe_2$);
a fifth insulating layer (preferably hBN);
a fifth TMDC layer (preferably $MoS_2$ or $WS_2$ or $WSe_2$);
a sixth insulating layer (preferably hBN); and
a second graphene layer comprising graphene or modified graphene;

wherein the layers are stacked sequentially in the order described to form a laminate structure.

In an embodiment, the sequence of layers described above for each of those heterostructures may themselves be sandwiched between two layers of insulating material (preferably hBN in each case) so that a layer of insulating material is disposed on top of the first and second graphene layers, respectively.

In another aspect of the invention, there is provided a method of making a heterostructure as described above.

The graphene used in any aspect of the invention may be pristine graphene or maybe chemically or physically modified graphene. A number of methods of chemically and or physically modified graphene are known in the art. The graphene functions as a conductive and transparent medium in the heterostructure. It is important that the graphene or modified graphene retains its metallic conductivity properties. It is also important that the graphene or modified graphene is transparent. The term "transparent" refers to the ability to allow passage of electromagnetic radiation through the structure and most particularly radiation in the visible or near visible region of the electromagnetic spectrum. Other metallic materials are unsuitable for the heterostructures of the present invention due to mechanical constraints and/or the fact that they are not transparent.

The semiconductor used in any aspect of the invention may be a direct band semiconductor. Such compounds are metal chalcogenides. These can be expressed as compounds of the formulae MX or $MX_2$ where M is a transition metal, or In or Ga, and where X is a chalcogen. Preferred materials are transition metal dichalcogenides (TMDCs) i.e. compounds of form $MX_2$ where M is a transition metal. Suitable materials include MoS2, WS2, and WSe2. Other materials that can be used as the semiconductor include MoSe2, MoTe2, WTe2, InSe and GaSe. These materials belong to a class of materials generally known as transition metal dichalcogenides though, strictly speaking, InSe and GaSe are not TMDCs. However, for the purposes of this invention they represent another group of preferred compounds included within the scope of the invention. Thus where a TMDC is described below in any particular embodiment or feature of the invention, InSe or GaSe could also be used in place of the TMDC which is specified.

The or each transition metal dichalcogenide (TMDC) layer is the photoactive layer which forms the basis for the quantum well. TMDCs are themselves structured such that each molecular layer of the material consists of a three atomic planes: a one atom thick layer of transition metal atoms (for example Mo, Ta, W . . . ) sandwiched between two one atom thick layers of chalcogen atoms (for example S, Se or Te). Thus in one embodiment, the TMDC is a compound of one or more of Mo, Ta and W with one or more of S, Se and Te. There is strong covalent bonding between the atoms within each layer of the transition metal chalcogenide and predominantly weak Van der Waals bonding between adjacent layers.

The insulating material used in any aspect of the invention must be carefully chosen and not all insulating materials are suitable. The insulating material is preferably hBN; however mica can also be used as an insulator. Although SiO2 has suitable electrical properties as an insulator, mechanically it is unsuitable for some of the end use applications envisaged by the present invention. In certain cases, SiO2 may be used as the insulator when mechanical properties are less critical.

Thus, in one embodiment, the heterostructure comprises a laminate formed from a first layer of graphene, a layer of hBN which forms a heterojunction with layer of graphene, a layer of a transition metal dichalcogenide (TMDC) adjacent to the layer of hBN which forms a heterojunction with the hBN, and a second layer of graphene adjacent to the layer of TMDC and forming a heterojunction therewith. In this structure, the TMDC acts as a semiconductor. The hBN acts as an insulator and the graphene layer behaves like a metallic layer.

The individual layers of graphene, the insulating material and the semiconductor layer are each atomically thin.

In certain cases, each one of these different types of layers may, entirely independent of one another, comprise a single atomic or molecular layer as appropriate i.e. be a monolayer or a single molecular layer or each may independently contain more than one atomic or molecular layer, for example from 2 to 15 atomic or molecular layers as appropriate. In the case of graphene a single layer of the material is an atomic layer, and in the case of hBN, a single layer of the material is an single molecular layer. In the case of the TMDCs, a molecular monolayer is actually three atomic layers thick.

In other words, the graphene layer may be a monolayer whilst the insulating layer independently may be a monolayer or equally may have from 2 to 15 atomic layers, or vice versa. Similarly, the insulator layer may independently be a monolayer or may have from 2 to 15 molecular layers (in the case of hBN, 2 to 15 atomic layers). Similarly, the semiconductor layer may independently be a monolayer or may have from 2 to 15 molecular layers. Equally, the or each TMDC layer may be independently a monolayer or from 2 to 15 molecular layers independent of the other layers present.

Ideally, the graphene layer is a single atomic layer. As more layers of graphene are added there is an increase in the amount of absorption. However, it is possible to have a few layers of graphene and thus the invention contemplates 2, 3, 4, and 5 layers. Consequently, the or each layer of graphene (in the bulk sense of representing one of the heterostructure laminate layers) is from about 0.3 nm to 2 nm thick. If the graphene layer is too thick, this results in a large absorption and a loss in transparency. That said, it would be possible to have a thicker graphene layer on one side of the heterostructure if this were desirable for other reasons. In such circumstances the thickness of this graphene layer could be, for example, up to 50 nm or 100 nm thick.

The or each layer of the insulator (in the bulk sense of representing one of the heterostructure laminate layers) is usually about 3 or 4 layers thick. In the case of hBN a single layer is about 0.3 nm to 0.5 nm thick and consequently each insulator layer may independently be from about 0.3 nm to 2 nm thick.

In an embodiment, the or each layer of TMDC (e.g. the layer of MoS2, WS2, or WSe2 etc.) is from 1 molecular layer to 6 molecular layers thick. Preferably the or each TMDC layer is a single molecular layer because this results in better confinement. Hence each TM DC may independently be about 0.5 nm to 3 nm thick.

In those heterostructures in which there is more than one layer of the same type of material i.e. more than one insulating layer and/or more than one semiconductor layer, different layers of the same type of material (which are disposed apart from one another in a laminate structure) may be formed from different materials. Thus a heterostructure may have both MoS2 and WSe2 as semiconductor layers within the same heterostructure. Similarly, the heterostructure may have more than one type of insulator such as having layers of both hBN and SiO2. Even in those cases when different layers of the same type of material are present in the heterostructure, it is possible for those different layers to have different atomic thicknesses and/or different orientations (for those materials in which differing crystal orientations are possible).

In another embodiment, the two graphene layers are separated by repeating alternating layers of hBN and a TMDC such as MoS2 such that the graphene layer is always in contact with a layer of hBN.

In some embodiments of the invention, the outer layers on one or both sides of the heterostructure are graphene or modified graphene. In other embodiments, the outer layers on one or both sides of the heterostructure may be a material such as hBN or Si or SiO2. In one embodiment, the outer layers on each side of the heterostructure are hBN.

The heterostructures of the present invention have the benefit of being efficient and flexible emitters of light in the visible and near visible regions of the electromagnetic spectrum. This makes the heterostructures of the present invention particular suitable for use in devices such as LEDs, flexible transparent displays, short range communication devices, and valley polarised light emission sources.

In an embodiment the layers of insulator and semiconductor in the heterostructure are stacked sequentially to form a laminate structure between the first and the second graphene layers. In the case of a heterostructure containing more than one quantum well i.e. a MQW structure, each transition metal dichalcogenide layer i.e. semiconductor layer is in electrical contact with an insulating layer so as to form an alternating structure of these two types of materials (even though the component materials for each subsequent layer of the same type may be different), with the alternating laminate then being sandwiched between two layers of graphene or modified graphene. As mentioned above, the graphene or modified graphene layer is always in contact with an insulating layer and not in contact with any semiconductor layer. In the case of the simplest, single quantum well structure, however, the single semiconductor layer is in contact with the second graphene layer.

The or each graphene layer may independently comprise modified graphene (e.g. doped graphene). Graphene is both an excellent conductor and is substantially transparent to actinic radiation, e.g. visible and near visible light. Graphene is also very flexible. Many of its derivatives (e.g. doped graphene) retain these properties. Graphene also has a variable work function which can be changed easily using electrostatic gating.

Thus, in an embodiment, the first graphene layer is formed from one or more two-dimensional crystals of graphene. Alternatively, the first graphene layer is formed from one or more two-dimensional crystals of modified graphene (e.g. doped graphene).

In an embodiment, the second graphene layer comprises graphene or modified graphene (e.g. doped graphene). In a further embodiment, the second graphene layer comprises graphene. In an alternative embodiment, the second graphene layer comprises modified graphene (e.g. doped graphene).

In an embodiment, the first and second graphene layers are formed of different materials. In this context, the term 'different materials' is intended to include differentially doped graphene (including the case where one layer is formed from graphene and the other is formed from a doped graphene).

The heterostructures of the invention show good quantum efficiencies. Increasing the number of quantum wells increases the quantum efficiency of the structure as a whole and consequently the anticipated light output. At the same time, the light output is dependent on the current through the structure and as the number of quantum wells is increased the current decreases although, to some extent, the light output generally stays the same due to the improved quantum efficiency.

The tunnel conductivity in the heterostructure may conveniently be thought of as the sum of the resistance of all the quantum wells in series in the heterostructure. Desirably, the insulating layers, usually hBN, individually and taken together are of sufficient thickness to prevent leakage of charge carriers (holes or electrons) from the wells to the graphene. Generally speaking, it is envisaged that with the quality currently available materials a heterostructure will ideally contain maximum of 20, 15, or 10 insulating layers such as hBN interrupted by a corresponding number of semiconductor layers forming the quantum wells. However, it is within the realms of contemplation that structures could be created with 50, 100 or even 200 layers when materials become available.

In an embodiment, the TM DC is $WS_2$ or $MoS_2$. Both $MoS_2$ and $WS_2$ have the ability to generate light in the visible part of the spectrum and this is roughly constant over 500-850 nm. In a further embodiment, the TMDC is $WS_2$. Bulk $WS_2$ has a convenient direct band gap of about 2.0 eV. One benefit of a 2-D crystal of $WS_2$ is that it is flexible. This means that it would be useful in the manufacture of displays etc.

The use of WS2 is particularly advantageous in a heterostructure because flexible structures can easily be made. A further advantage of $WS_2$ is its chemical stability and its photostability, meaning it does not undergo photocorrosion in the same way that silicon does. This stability, and the longevity which arises as a result, is inherent in $WS_2$ and renders it a useful material for heterostructures of this type which are intended to be used in display type applications. In contrast, existing materials used for such applications may require additional processing steps to increase their longevity. MoS2 is also stable.

At the simplest level the heterostructures of the present invention contain three different types of materials arranged in a careful sequence in order to achieve the desired effect. These are: metallic layers (graphene), insulating layers (hBN) and semiconductor layers (such as WS2 and MoS2)

The quantum efficiency (QE) is improved by employing multiple quantum wells stacked in series because it increases the thickness of the tunnel barrier. At the same time, the overall current reduces and it is therefore necessary to balance the increase in quantum efficiency against the reducing current which in turn reduces light output from individual quantum wells. In other words, the efficiency is expected to increase with increasing number of quantum wells.

The simplest structure according to the invention that could feasibly emit light is a structure such as Gr-hBN-TMDC-Gr, with Gr representing graphene or modified graphene. Interestingly, it is possible to omit one hBN layer so that, on one side of the heterostructure, the graphene is in direct contact with the TM DC.

Thus, in a second aspect of the invention the heterostructure containing only the following layers in sequence:
a first graphene layer comprising graphene or modified graphene;
a first insulating layer (preferably hBN);
a first TMDC layer (preferably MoS2 or WS2 or WSe2); and
a second graphene layer comprising graphene or modified graphene;

wherein the layers are stacked sequentially in the order described to form a laminate structure, and optionally wherein an outer layer of hBN is stacked on top of one or both of the first and second graphene layers so as to encapsulate the heterostructure.

In this aspect of the invention, the heterostructure comprises two layers of graphene which are separated by a layer of insulating material and a layer of semiconductor. This is a single quantum well device.

The embodiments described above in relation to the first aspect of the invention may also apply, where physically possible, to the second aspect of the invention.

In an embodiment of this second aspect of the invention, the heterostructure may form a component part of a larger heterostructure. Thus, one or more additional layers may be present on top of the first graphene layer. Independently, one or more additional layers may be present on top of the second graphene layer. The additional layers may on each occasion be independently selected from hBN, SiO2 and Si.

The heterostructure may be mounted on a substrate, such as plastics or metal, or on another structure.

In some cases the heterostructures illustrated in the present invention are symmetrical whereas others are asymmetric. Asymmetry can arise from having different thickness of hBN layers above and below the TMDC layer. Introducing asymmetry may allow you to access electroluminescence (EL) from different charge states. Thus in certain cases it may be desirable to make the device asymmetric.

The heterostructures of the present invention may have more than one different type of semiconductor layer in the heterostructure. Ideally, the smallest band gap semiconductor is arranged on the bottom of the structure so light can pass unimpeded upwards through the larger gap semiconductors. The efficiencies obtained by the heterostructures of the present invention (which have not yet been optimised to their maximum extent) nevertheless are already comparable to organic light emitting diodes (OLEDS). It is anticipated that the efficiency of existing commercial LED's, which are about 40% efficient, will be matched or exceeded as the material quality improves.

In a third aspect of the invention is provided an electrical device comprising a heterostructure according to the first or second aspects. The device may, for example, be an LED or it may be any other form of electrical device described in this specification.

BRIEF DESCRIPTION OF THE DRAWINGS

Embodiments of the invention are further described hereinafter with reference to the accompanying drawings.

FIG. 1a, represents a schematic diagram of the SQW heterostructure hBN/GrB/2hBN/WS2/2hBN/GrT/hBN. FIG. 1b is a cross-sectional bright-field STEM image of the type of heterostructure presented in a. Scale bar, 5 nm. FIGS. 1c and d represent schematic and STEM images of the MQW heterostructure hBN/GrB/2hBN/MoS2/2hBN/MoS2/2hBN/MoS2/2hBN/MoS2/2hBN/GrT/hBN. The number of hBN layers between MoS2 QWs in FIG. 1d varies. Scale bar, 5 nm. FIG. 1e shows an optical image of an operational device (hBN/GrB/3hBN/MoS2/3hBN/GrT/hBN). The dashed curve outlines the heterostructure area. Scale bar, 10 μm. FIG. 1f shows an optical image of EL from the same device. Vb=2.5V, T=300 K. 2hBN and 3hBN stand for bi- and trilayer hBN, respectively. FIG. 1g shows a schematic of another heterostructure according to the invention consisting of Si/SiO2/hBN/GrB/3hBN/MoS2/3hBN/GrT/hBN. FIGS. 1h-j are band diagrams for the case of zero applied bias (h), intermediate applied bias (i) and high bias (j) for the heterostructure presented in FIG. 1g.

FIG. 2a illustrates a colour map of the PL spectra as a function of Vb for a MoS2-based SQW. The white curve is the dI/dVb of the device. Excitation energy EL=2.33 eV. FIG. 2b shows EL spectra as a function of Vb for the same device as in FIG. 2a. White curve: its j-Vb characteristic (j is the current density). FIG. 2c illustrates a comparison of the PL and EL spectra for the same device. As PL and EL occur in the same spectral range, we measured them separately. FIGS. 2d-g illustrate the same as in FIGS. 2b and c but for the bilayer (FIGS. 2d and e) and monolayer (FIGS. 2f and g) WS2 QWs. The PL curves were taken at Vb=2.4V (FIG. 2c), 2.5 V (FIG. 2e) and 2 V (FIG. 2g); the EL curves were taken at Vb=2.5 V (FIG. 2c), 2.5 V (FIG. 2e) and 2.3 V (FIG. 2g).

FIG. 3a shows the modulus of the current density through a triple QW structure based on MoS2. FIG. 3b shows its schematic structure. FIGS. 3c and d show maps of PL and EL spectra for this device. EL=2.33 eV. FIG. 3e shows individual EL spectra plotted on a logarithmic scale which show the onset of EL at 1.8 nA μm-2 (blue curve). Olive and red: j=18 and 130 nA μm-2, respectively. FIG. 3f is a comparison of the EL (taken at Vb=8.3 V) and PL (taken at Vb=4.5 V) spectra.

FIGS. 4a-c show EL at negative (a) and positive (c) bias voltages for the device with two QWs made from MoS2 and WSe2 schematically shown in the inset in d. Its PL bias dependence is shown in FIG. 4b, for laser excitation EL=2.33 eV, T=7 K. White curve: |j|-Vb characteristics of the device. FIG. 4d shows the temperature dependence of EQE for a device with two QWs made from MoS2 and WSe2. Inset: schematic representation of a device with two QWs produced from different materials. FIG. 4e shows an optical micrograph taken in reflection mode of a SQW (MoS2) device on PET. FIG. 4f shows an optical micrograph of the same device as in FIG. 4e taken in transmission mode. For FIGS. 4e and f, the area of the stack is marked by red rectangles; scale bars are 10 μm. g, EL spectra for the device in FIGS. 4e and f at zero (blue dots) and 1% (red dots) strain. Vb=-2.3 V, I=-40 μA at room T.

DETAILED DESCRIPTION

Figure 1:
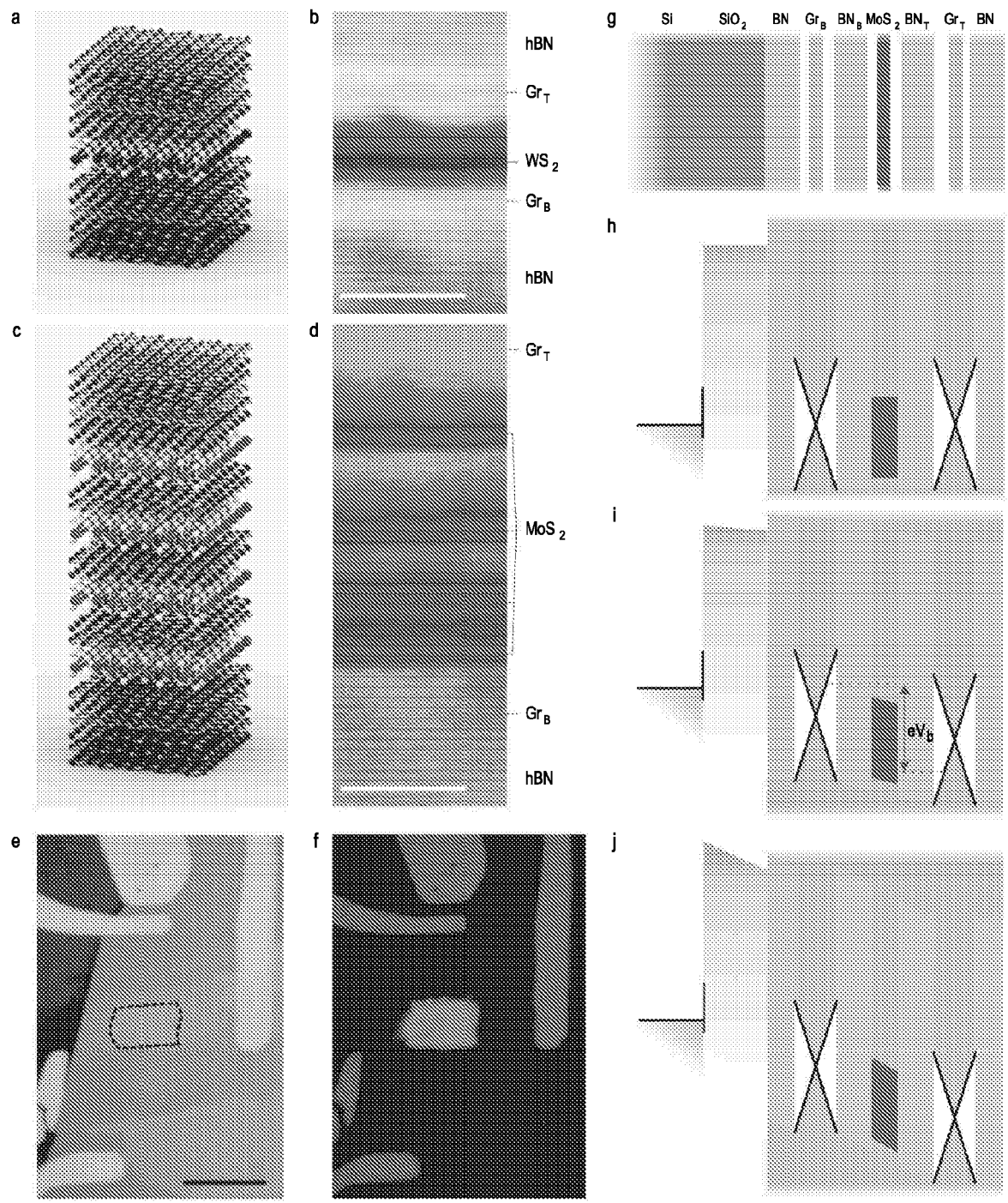
FIG. 1 schematically shows the architecture of single$_{[sH1]}$-quantum-well (SQW) and MQW structures along with optical images of a typical device (FIG. 1e).

The term 'vertical heterostructure' refers to a plurality of two-dimensional crystals arranged in a stack. A heterostructure comprises at least two different materials. The two-dimensional crystals are arranged such that the heterostructures are substantially parallel, being arranged face-to-face, forming a laminate. Such heterostructures may also be called two-dimensional heterostructures.

For the purposes of the present invention, the heterostructure is formed entirely of two-dimensional crystals. This does not preclude the heterostructure from being mounted on a substrate and/or have a protective coating. A two-dimensional heterostructure is so-called because it is comprised of two-dimensional crystals. It will itself, of course, be a three dimensional structure.

Examples of two-dimensional crystals which may be included in the heterostructures of the invention include graphene, modified graphene (e.g. doped graphene, graphane, fluorographene, chlorinated graphene), BN, $MoS_2$, $NbSe_2$, $Bi_2Te_3$, $MgB_2$, $WS_2$, $MoSe_2$, $TaSe_2$, $NiTe_2$.

Heterostructures may be formed by placing two-dimensional crystals upon one another mechanically, epitaxially, from solution and/or using any other means which would be apparent to the person skilled in the art.

A graphene heterostructure comprises at least layers of a two-dimensional crystal of graphene or modified graphene.

The term 'two dimensional crystal' means a crystal which is so thin that it exhibits different properties than the same material when in bulk. Not all of the properties of the material will differ between a two-dimensional crystal and a bulk material but one or more properties are likely to be different. A more convenient definition would be that the term 'two-dimensional crystal' refers to a crystal that is 10 or fewer molecular layers thick, e.g. one molecular layer thick, but this depends on the material. Crystals of graphene which have more than 10 molecular layers (i.e. 10 atomic layers) generally exhibit properties more similar to graphite than to graphene. A molecular layer is the minimum thickness chemically possible for that material. In the case of graphene one molecular layer is a single atom thick. The same is true of boron-nitride. In the case of the transition metal dichalcogenides (e.g. $MoS_2$ and $WS_2$), a molecular layer is three atoms thick (one transition metal atom and two chalcogen atoms). Thus, two-dimensional crystals are generally less than 50 nm thick, depending on the material and are preferably less than 20 nm thick. Graphene two-dimensional crystals are generally less than 3.5 nm thick and may be less than 2 nm thick.

The term 'two dimensional crystal' includes crystals which are doped, as described below.

The term 'modified graphene' refers to a graphene-like structure that has been modified in some way. Thus, the modified graphene may be graphene which has been doped. This may have the purpose of modifying the work function of graphene without significantly reducing its conductivity. Examples of compounds which can be used to dope graphene are: $NO_2$, $H_2O$ and $I_2$, which act as acceptors to provide a p-doped graphene; or $NH_3$, CO and $C_1$-$C_3$ alcohols (e.g. ethanol), which act as donors to provide an n-doped graphene. Small amounts of doping can increase the transparency of the doped graphene relative to graphene but the dopant itself may absorb or reflect light. Conventional methods of doping the graphene can be used to improve the functionality of the graphene, including its transparency to actinic radiation. These methods of doping are described in the literature and are not therefore reproduced here. An alternative approach to doping is to place metal (e.g. gold) nanostructures on the surface of the graphene. This will both dope the graphene and increase the local electric field. A preferred dopant is one which is not chemically bonded to graphene but which is able to transfer charge to graphene, effectively altering the graphene's work function.

When graphene is placed in contact with a transition metal dichalcogenide layer, there is a dopant effect, i.e. the graphene's work function is changed.

As used in this specification, a 'layer' of a material refers to a plane of that material. Each 'layer' may comprise any number of molecular layers of the same chemical composition. Thus a layer of graphene does not necessarily mean a graphene monolayer, although it might. Likewise, a layer of $WS_2$ does not necessarily refer to a $WS_2$ monolayer, although it might. In many embodiments of this invention, a 'layer' of any material means a two dimensional crystal of that material.

FIG. 1 schematically shows the architecture of single-quantum-well (SQW) and MQW structures along with optical images of a typical device (FIG. 1e). We used a peel/lift van der Waals technique to produce the devices of the invention. In total we measured more than a dozen of such QW structures comprising single and multiple layers of TMDC flakes from different materials: MoS2, WS2 and WSe2. The yield was 100% with every device showing strong EL that remains unchanged after months of periodic measurements, which demonstrates the robustness of the technology and materials involved.

Cross-sectional bright-field scanning transmission electron microscope (STEM) images of our SQW and MQW devices demonstrate that the heterostructures are atomically flat and free from interlayer contamination (FIG. 1b,d). The large atomic numbers for TMDCs allow the semiconductor crystals to be clearly identified owing to strong electron-beam scattering (dark contrast observed in FIG. 1b, d). Other layers were identified by energy-dispersive X-ray spectroscopy. The large intensity variation partially obscures the lattice contrast between adjacent layers but, despite this, the hBN lattice fringes can clearly be seen in FIG. 1b, d. The different contrast of the four MoS2 monolayers in the MQW of FIG. 1d is attributed to their different crystallographic orientations (confirmed by rotating the sample around the heterostructure's vertical direction, which changes the relative intensity of different layers).

Figure 2:
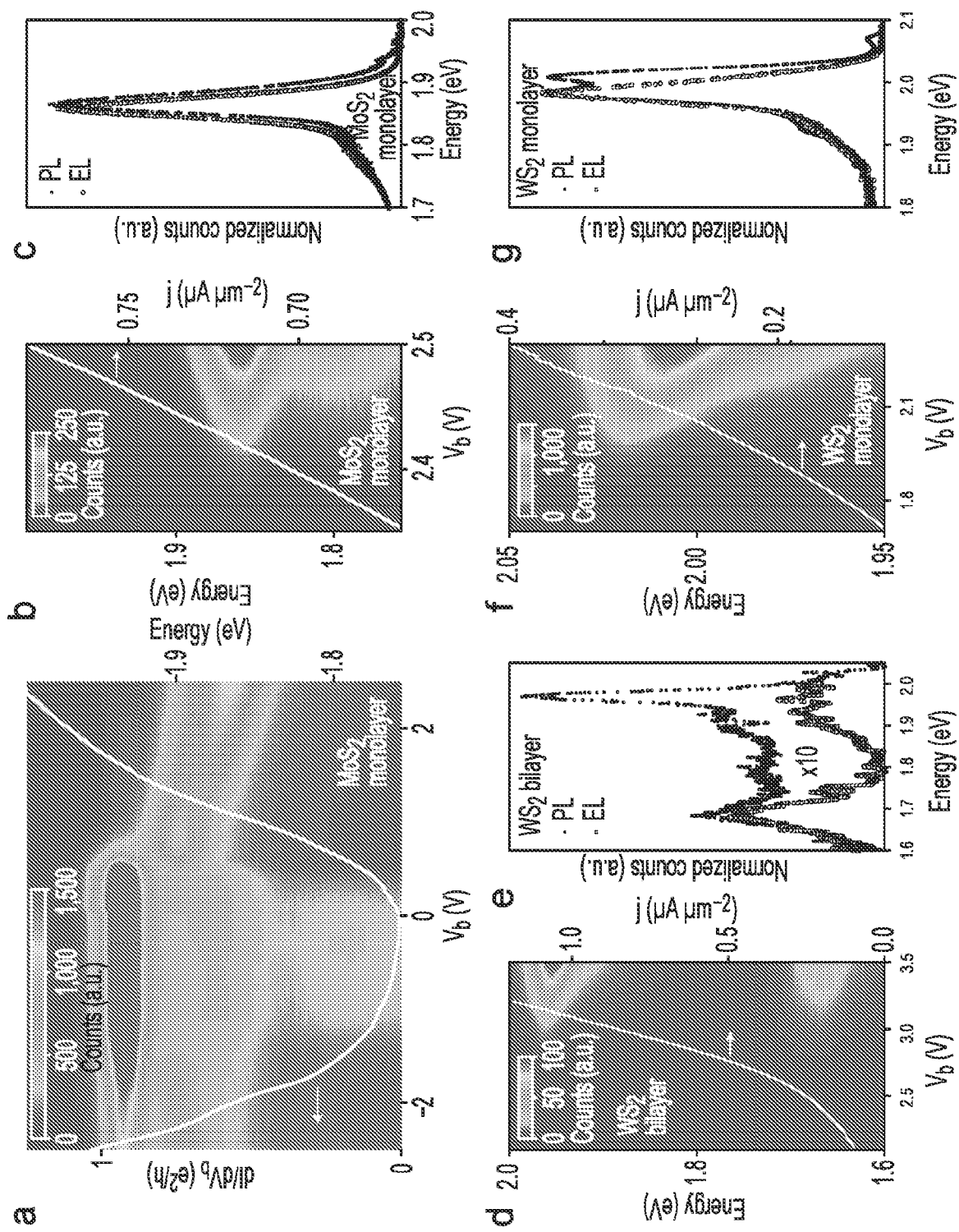
FIG. 2 shows optical and transport characterisation of a SQW devices, T=7K.

For brevity we concentrate on current-voltage (I-V) characteristics, photoluminescence (PL) and EL spectra from symmetric devices based on MoS2 (FIG. 2a-c). Devices based on WS2 and devices with asymmetric barriers were also investigated.

At low Vb, the PL in FIG. 2a is dominated by the neutral A exciton, X0, peak at 1.93 eV. We attribute the two weaker and broader peaks at 1.87 and 1.79 eV to bound excitons. At a certain Vb, the PL spectrum changes abruptly with another peak emerging at 1.90 eV. This transition is correlated with an increase in the differential conductivity (FIG. 2a). We explain this transition as being due to the fact that at this voltage the Fermi level in the bottom graphene electrode (GrB) rises above the conduction band in MoS2, allowing injection of electrons into the QW (FIG. 1i). This allows us to determine the band alignment between the Dirac point in graphene and the bottom of the conductance band in MoS2: the offset equals half of the bias voltage at which the tunnelling through states in the conductance band of MoS2 is first observed. To take into account the effects of possible variance in the thickness of hBN barriers and small intrinsic doping of graphene, we average the onset of tunnelling through MoS2 for positive and negative bias voltages (FIG. 2a), which yields the offset to be ~0.5 eV—in agreement with theoretical prediction.

The injection of electrons into the conduction band of MoS2 leads not only to an increase in tunnelling conductivity but, also, to accumulation of electrons in MoS2 and results in formation of negatively charged excitons, X−. The X− peak is positioned at a lower energy compared with the X0 peak owing to the binding energy, EB, of X−. In the case of MoS2 we estimate EB as ≈36 meV near the onset of X−. As the bias increases, the energy of the X− peak shifts to lower values, which can be attributed either to the Stark effect or to the increase in the Fermi energy in MoS2.

In contrast to PL, EL starts only at Vb above a certain threshold (FIG. 2b). We associate such behaviour with the Fermi level of the top graphene (GrT) being brought below the edge of the valence band so that holes can be injected into MoS2 from GrT (in addition to electrons already injected from GrB) as sketched in FIG. 1j. This creates conditions for exciton formation inside the QW and their radiative recombination. We find that the EL frequency is close to that of PL at Vb≈2.4 V (FIG. 2a-c), which allows us to attribute the EL to radiative recombination of X−. Qualitatively similar behaviour is observed for WS2 QWs (FIG. 2d-g).

An important parameter for any light-emission device is the QE defined as η=N2e/I (here e is the electron charge, N is the number of the emitted photons and I is the current). For SQWs we obtain quantum efficiencies of ~1%—this value by itself is ten times larger than that of conventional planar p-n diodes and 100 times larger than EL from Schottky barrier devices. Our rough estimations show that the external QE (EQE) for PL is lower than that for EL. Relatively low EQE found in PL indicates that the crystal quality itself requires improvement and that even higher EQE in EL may then be achieved.

Figure 3:
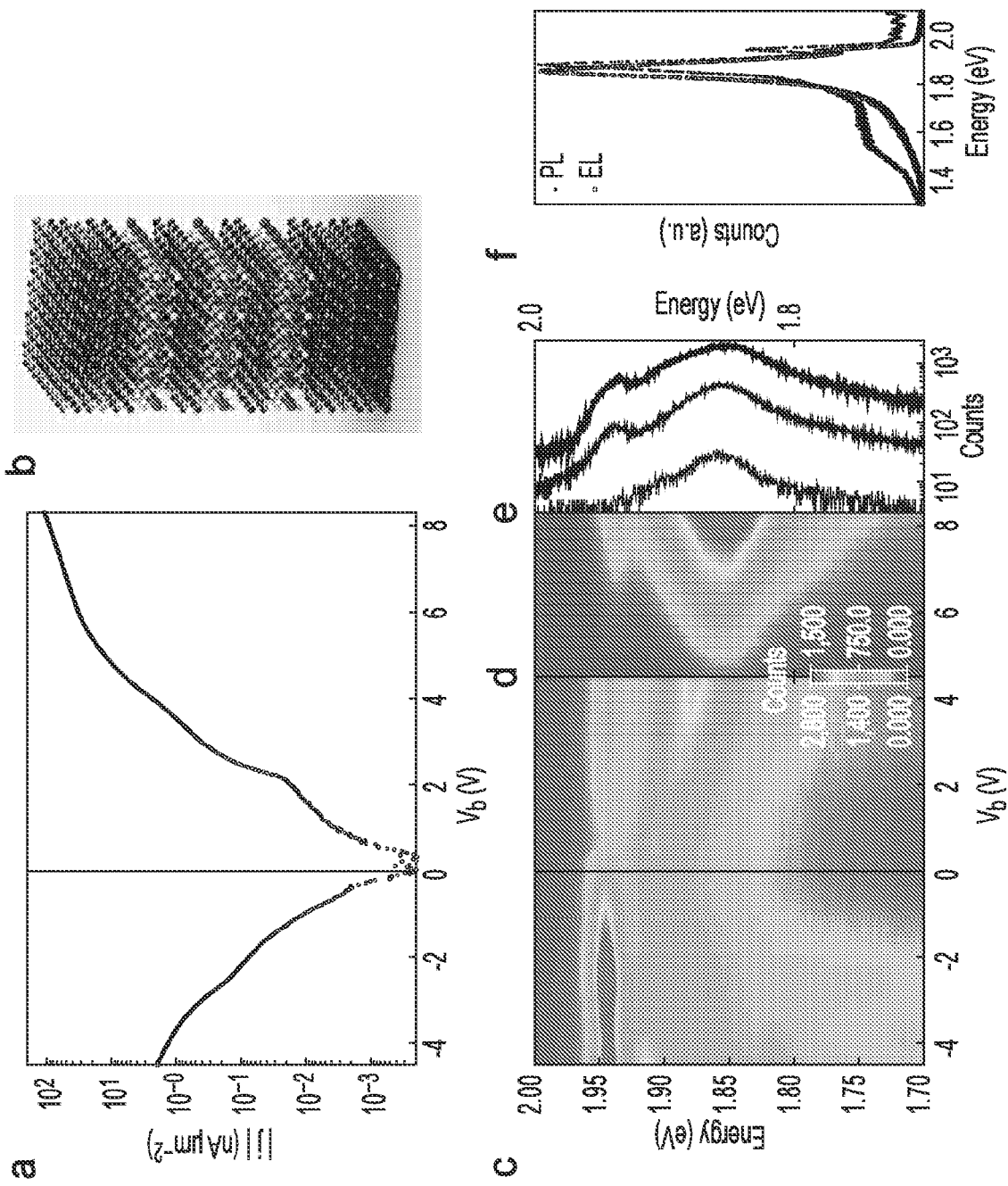
FIG. 3 shows optical and transport characteristics of MQW devices, T=7K.

To enhance QE even further, we have employed multiple QWs stacked in series, which increases the overall thickness of the tunnel barrier and enhances the probability for injected carriers to recombine radiatively. FIG. 3 shows the results for one of such MQW structures with three MoS2 QWs (layer sequence: Si/SiO2/hBN/GrB/3hBN/MoS2/3hBN/MoS2/3hBN/MoS2/3hBN/GrT/hBN) and another MQW with four asymmetric MoS2 QWs (FIG. 1c,d) was also investigated. The current increases with Vb in a step-like manner, which is attributed to sequential switching of the tunnelling current through individual MoS2 QWs. PL for the MQW device is qualitatively similar to that of SQW devices but the X0 peak is replaced with a X− peak at Vb=0.4 V (FIG. 3c).

The X0 peak reappears again at Vb>1.2 V. This can be explained by charge redistribution between different QWs. The EL first becomes observable at Vb>3.9 V and j of 1.8 nA μm−2 (FIG. 3d,e). This current density is nearly 2 orders of magnitude smaller than the threshold current required to see EL in similar SQWs. Importantly, the increased probability of radiative recombination is reflected in higher QE, reaching values of about 8.4% (for the device with quadruple QW, 6% for triple). This high QE is comparable to the efficiencies of the best modern-day organic LEDs (ref. 29).

Figure 4:
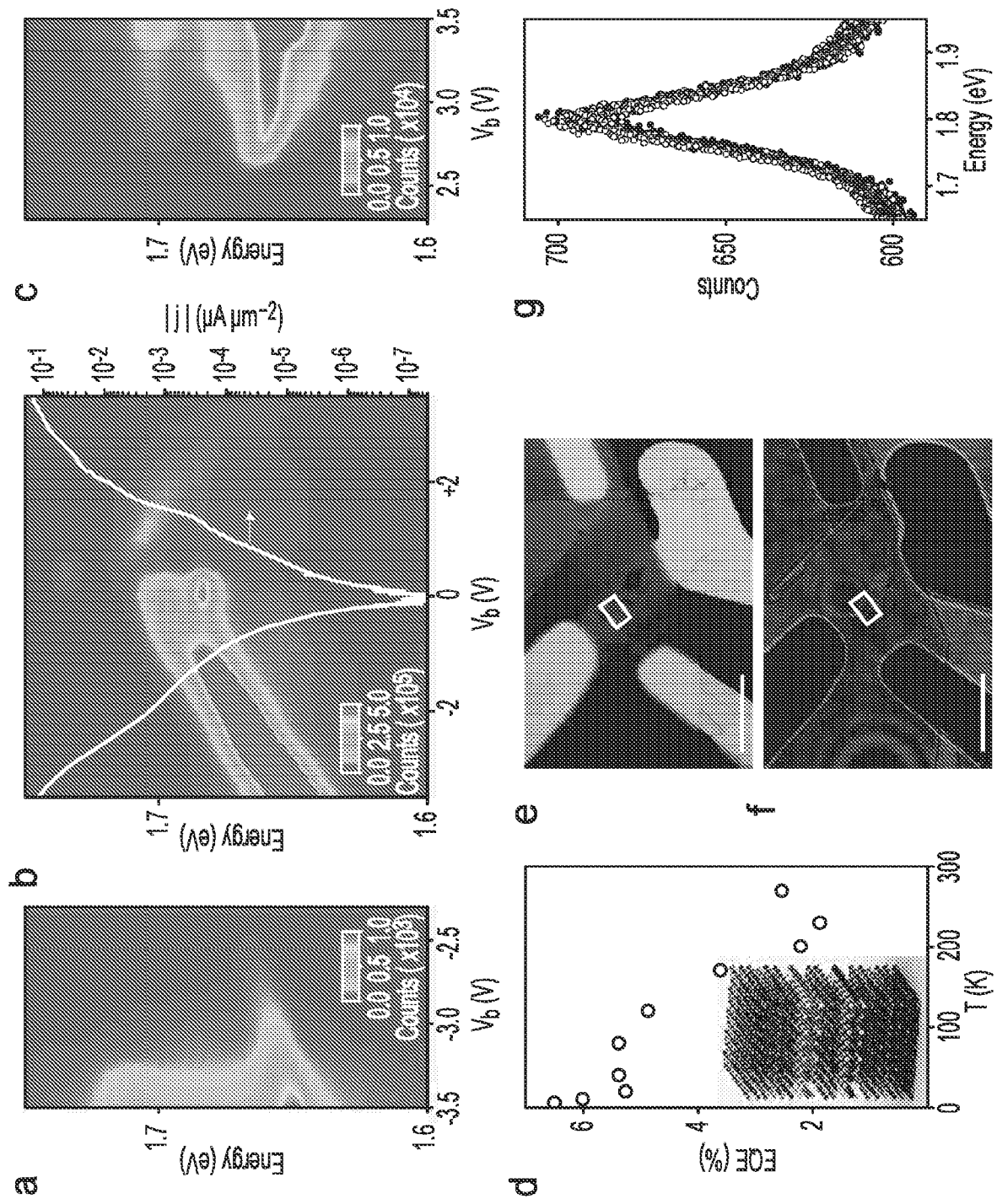
FIG. 4 shows devices combining different QW materials and on flexible substrates.

The described technology of making designer MQWs offers the possibility of combining various semiconductor QWs in one device. FIGS. 4a-c describes an LED made from WSe2 and MoS2 QWs: Si/SiO2/hBN/GrB/3hBN/WSe2/3hBN/MoS2/3hBN/GrT/hBN. EL and PL occur here in the low-E part of the spectra and can be associated with excitons and charged excitons in WSe2. However, in comparison with SQW devices, the combinational device in FIG. 4 exhibits intensities more than an order of magnitude stronger for both PL and EL, yielding about 5% QE. We associate this with charge transfer between the MoS2 and WSe2 layers such that electron-hole pairs are created in both layers but transfer to and recombine in the material with the smaller bandgap. Such a process is expected to depend strongly on band alignment, which is controlled by bias and gate voltages. This explains the complex, asymmetric Vb dependence of PL and EL in FIG. 4.

Generally, the fine control over the tunnelling barriers allows a reduction in the number of electrons and holes escaping from the quantum well, thus enhancing EQE. EQE generally demonstrates a peak at T around 50-150 K, depending on the material. Depending on the particular structure we found that typical values of EQE for MoS2- and WS2-based devices at room T are close or a factor of 2-3 lower than those at low T (FIG. 4d).

Finally, we note that because our typical stacks are only 10-40 atoms thick, they are flexible and bendable and, accordingly, can be used for making flexible and semi-transparent devices. To prove this concept experimentally, we have fabricated a MoS2 SQW on a thin PET (polyethylene terephthalate) film (FIG. 4e,f). The device shows PL and EL very similar to those in FIG. 2a-c. We also tested the device's performance under uniaxial strain of up to 1% (using bending) and found no changes in the EL spectrum (FIG. 4g).

In summary, we have demonstrated band-structure engineering with one atomic layer precision by creating QW heterostructures from various 2D crystals including several TMDCs, hBN and graphene. Our LEDs based on a single QW already exhibit QE of above 1% and line widths down to 18 meV, despite the relatively poor quality of available TMDC layers. This EQE can be improved significantly by using multiple QWs. Consisting of 3 to 4 QWs, these devices show EQEs up to 8.4%. Combining different 2D semiconductor materials allows fine-tuning of the emission spectra and also an enhanced EL with a quantum yield of 5%. These values of QE are comparable to modern-day organic LED lighting and the concept is compatible with the popular idea of flexible and transparent electronics. The rapid progress in technology of chemical vapour deposition growth will allow scaling up of production of such heterostructures.

Methods

Sample fabrication. Flakes of graphene, hBN and TMDCs are prepared by micromechanical exfoliation of bulk crystals. Single- or few-layer flakes are identified by optical contrast and Raman spectroscopy. Heterostructures are assembled using the dry peel/lift method. Electrical contacts to the top and bottom graphene electrodes are patterned using electron-beam lithography followed by evaporation of 5 nm Cr/60 nm Au.

Electrical and optical measurements. Samples are mounted within a liquid helium flow cryostat with a base temperature of T=6 K. Electrical injection is performed using a Keithley 2400 source meter. To measure PL the samples were excited with a continuous wave 532 nm laser, focused to a spot size of ~1 μm through a ×50 objective (NA=0.55) at a power less than required to modify the spectral line shape. The signal was collected and analysed using a single spectrometer and a nitrogen cooled CCD (charge-coupled device).

Scanning transmission electron microscopy. STEM imaging was carried out using a Titan G2 probe-side aberration-corrected STEM operating at 200 kV and equipped with a high-efficiency ChemiSTEM energy-dispersive X-ray detector. The convergence angle was 19 mrad and the third-order spherical aberration was set to zero (±5 µm). The multilayer structures were oriented along the hkl0 crystallographic direction by taking advantage of the Kikuchi bands of the silicon substrate.

In another embodiment of the invention, we also investigated high efficiency quantum well LEDs based on WSe2 monolayers. Thus in addition to the findings above, we have separately also shown that WSe2 single quantum wells exhibit an unusual temperature dependence in the electroluminescence quantum efficiency. Surprisingly, we have found the EL quantum efficiency to increase in some samples by 2 orders of magnitude when the temperature is increased from T=6 K to T=300 K. The room temperature quantum efficiency approaches ~20% which is comparable to current LED lighting. Unlike conventional LED devices our WSe2 LED's show no drop off in the emission efficiency up to 1000 A/cm2. Again, this is an unexpected development and means that such devices could pave the way towards ultra-bright flexible lighting, 2D lasers and future near infra-red communication devices.

As with the heterostructures above, the devices of this embodiment of the invention are carefully fabricated by mechanically transferring individually exfoliated flakes of graphene, few layer hexagonal boron nitride (hBN) and WSe2 monolayers into a quantum well architecture.

More particularly, we found that QW's consisting of single layer WSe2 show 2-orders of magnitude brighter electroluminescence (EL) than the other studied TMDC's such as MoS2, WS2 and MoSe2 and that the quantum efficiency of the EL process increases 250 times to nearly 20% when increasing the temperature from T=6 K to T=300 K, this quantum efficiency is comparable to current commercial LED lighting and such a temperature dependence of the emission efficiency has not been reported elsewhere in any other system. Furthermore we also observed that some devices with thinner hBN tunnel barriers exhibit an absence of droop in the light output vs injection current up to a maximum achieved current density of 1000 A/cm2.

Figure 5:
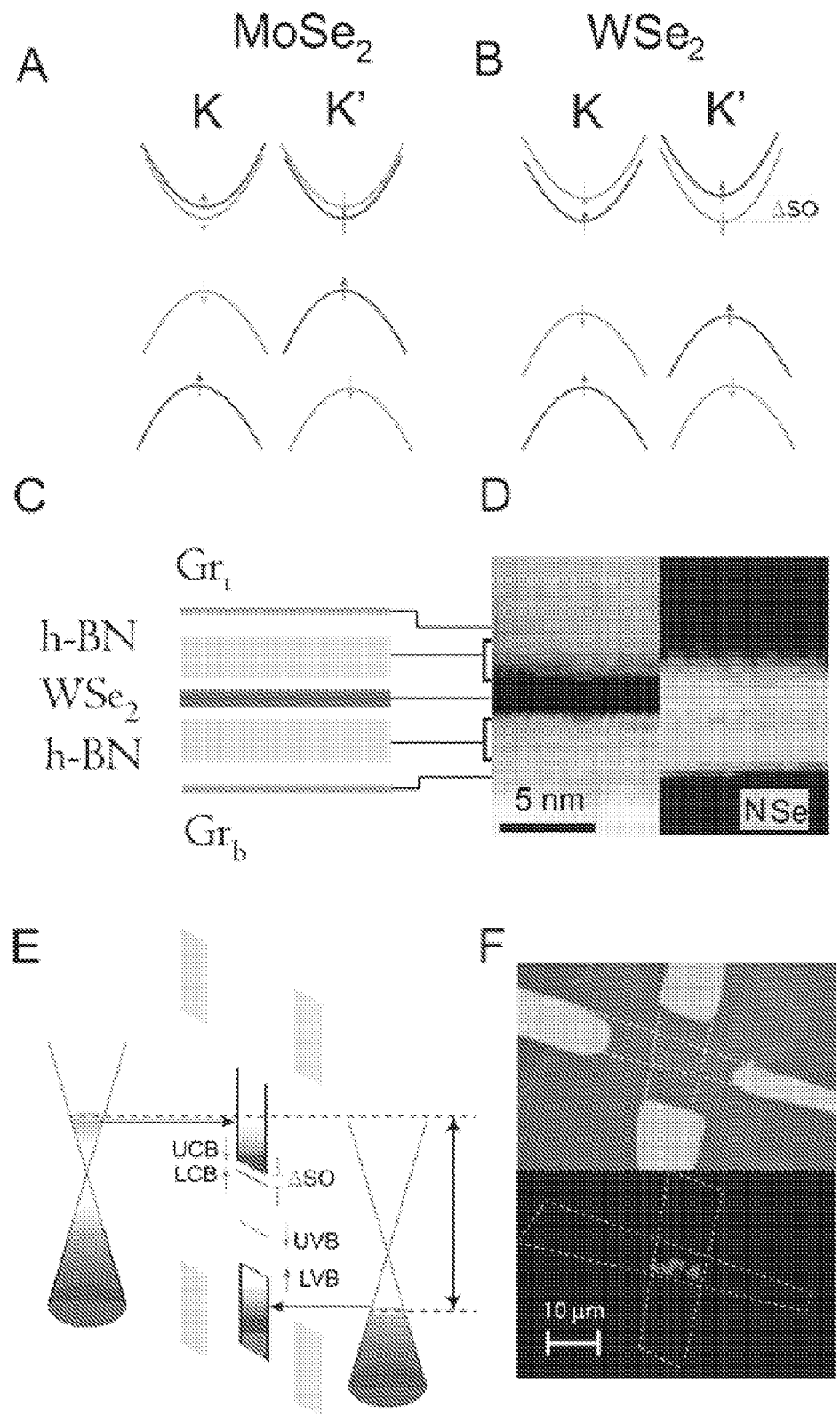
FIG. 5 shows a WSe2 Quantum well structure. (A) Schematic of WSe$_2$ singe quantum well. (B) Band alignment diagram for the QW LED shown in (A). (C) cross sectional scanning transmission electron microscope (STEM) high angle annular dark field (HAADF) image of the QW LED. (D) Electron energy loss spectroscopy (EELS) chemical map of nitrogen and selenium confirming device structure. Scale bar 5 nm.

FIG. 5A shows the devices structure. We make use of graphene as a transparent and conductive window which can inject either electrons or holes due to its low intrinsic doping levels, hBN as an atomically flat and defect free tunnel barrier and single layer WSe2 as the semiconducting element of the quantum well. The light emission process occurs when both electrons and holes are simultaneously injected into the conduction band and valence band respectively of the WSe2 layer through the thin hBN tunnel barrier FIG. 5B. This can only occur when a significant threshold bias is applied across the graphene electrodes.

Processing contamination has been found to limit the performance of Van der Waals heterostructure devices so to confirm the geometry of our devices and to access contamination levels within our devices we take a cross sectional slice through the heterostructure stack and image with atomic resolution using scanning transmission electron microscopy (STEM). FIG. 5C shows the bright field cross sectional image of one of our devices showing individual atomic layers of h-BN and a central WSe2 monolayer encapsulated by hBN. Electron energy loss spectroscopy (EELS) mapping, FIG. 5D confirms the presence of nitrogen (corresponding to regions of hBN) and selenium (corresponding to regions of WSe2) confirming the formation of atomically flat and clean interfaces and the encapsulation between few layer hBN tunnel barriers (See methods and Supplementary for more details on cross sectional imaging).

Figure 6:
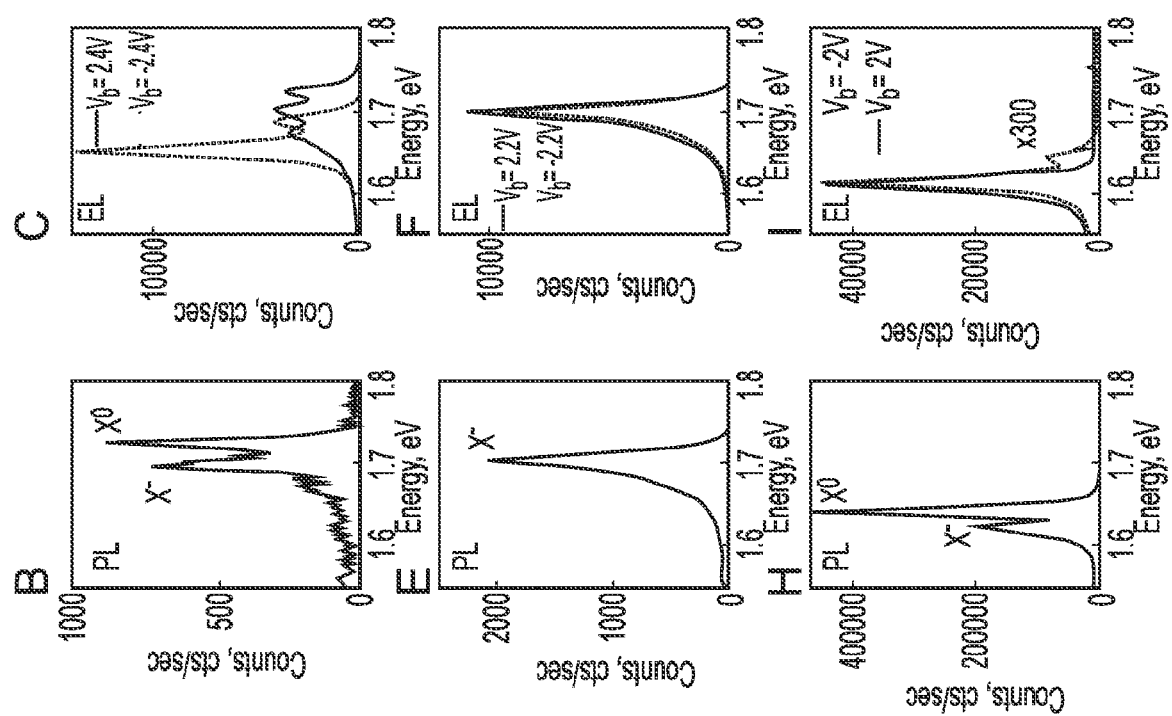
FIG. 6 shows (A) Contour map of the electroluminescence for negative bias with current density plotted against bias (right axis) (B) Contour map of the photoluminescence spectra for different bias voltage with the modulus of the current density plotted (right axis) (P=10 uW, E=2.33 eV) (C) Contour map of the electroluminescence for positive bias voltage with current density plotted (right axis).
Figure 6:
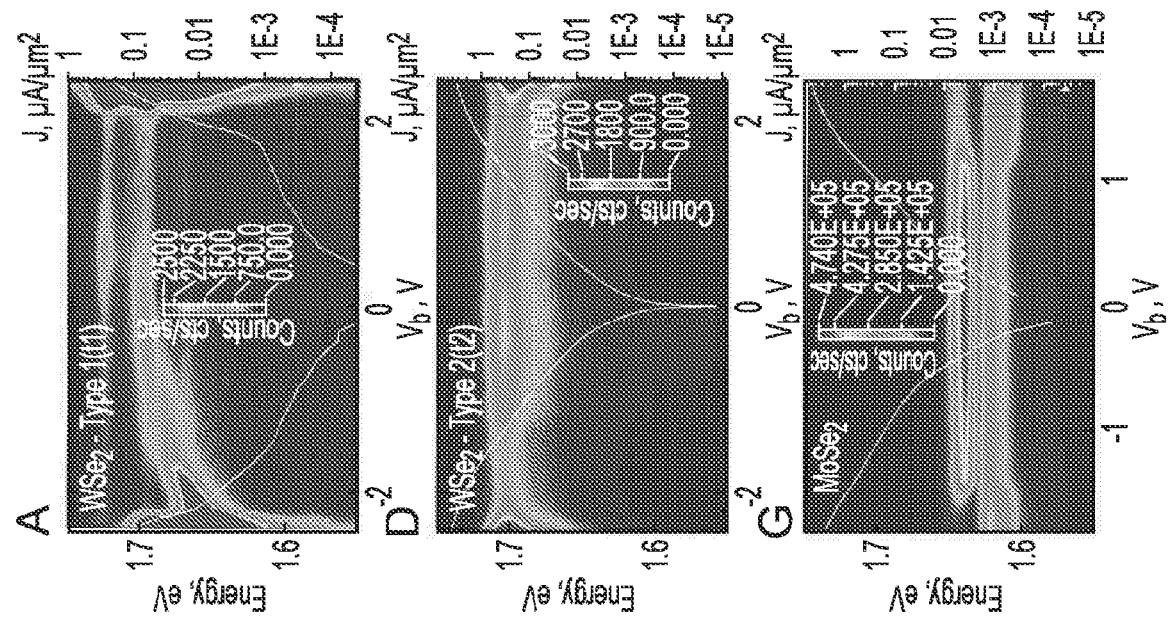

We study the PL and EL properties of these QW LED's by utilising a variable temperature flow cryostat with a base temperature of T=6 K (See methods for measurement details) We start by describing the low temperature (T=6 K) photoluminescence and electroluminescence properties of a typical WSe2 quantum well with device structure Grb—2L hBN—1L WSe2-2L hBN-Grt. FIG. 6(B) shows the bias voltage dependence of the photoluminescence. Our devices show a pronounced peak in the PL at an energy of E=1.70 eV which we attribute to the neutral exciton, the linewidth is found to be ~16 meV with a poorly resolved charged exciton state at a lower energy of 1.68 eV with a linewidth of ~40 meV. This linewidth is broader than reported elsewhere and can be attributed to inhomogeneous broadening and depends on the source of the material, however similar behaviour can be observed from cleaner WSe2 from different sources (See supplementary information).

The PL line shape shows insensitivity to applied bias voltage only changing in intensity for large bias voltages. As the bias voltage is increased to Vb=2.0 V the PL increases rapidly due to the emergence of electroluminescence, which is clearly seen when the excitation laser is switched off and only EL is collected Figure (A,C). Electroluminescence occurs when the Fermi level of one of the graphene electrodes is coincident with or above the energy of the conduction band in the TMDC and the Fermi level of the other graphene electrode is coincident or below the valence band thus enabling the simultaneous injection of electrons and holes which form excitons and decay releasing photons.

One major limitation of conventional light emission devices is the temperature dependence of the quantum efficiency. In many such devices, quantum efficiency drops by a factor of 10 from low temperature to room temperature. This is commonly caused by the high temperature ionisation of impurities due to crystal growth defects and other defects. The resultant charged impurity left behind can acts as a scattering centre which leads to the increase of non-radiative recombination and thus a reduced efficiency.

Unique to the WSe2 QW we observe in some cases a 250 fold increase in the quantum efficiency as the temperature is increased from T=6 K to T=300 K.

We now describe some particularly interesting results in relation to tungsten-based TMDCs.

The external quantum efficiency (EQE) demonstrated by many conventional van der Waals LEDs is of the order of 1%, and is even smaller for planar devices. We have found that certain tungsten-based TMDCs (such as $WSe_2$ and WS2), when used as emitting layer in our vertical LED, can offer EQE which increase with temperature and which can easily reach 20% at room temperature. This makes such devices potentially interesting for real life applications. We think that such behaviour is a consequence of the peculiar band structure of tungsten-based TMDC, which have long-living dark excitons as the ground state when incorporated in one of the heterostructures of the invention. Thus, another embodiment of the invention is the provision of a van der Waals structure i.e. a heterostructure such as those described above, in which the external quantum efficiency is greater than 10% and more preferably is greater than 20%.

The strong spin-orbit interaction in W-based TMDCs leads to the lowest energy states in the conductance band and the highest energy states in the valence band to have opposite spin orientation. The interesting effects which we have observed in electroluminescence (EL) for WSe$_2$ or WS$_2$ LEDs, arises because electrons and holes are injected separately thereby creating an electron-hole imbalance and giving rise to new channels of exciton recombination.

We have prepared vertical LED van der Waals heterostructures using WSe$_2$ and WS$_2$ as the light emitting QW. The structures consist of a monolayer of W-based TMDC separated from graphene electrodes by thin (2-3 monolayers) hBN barriers. This is shown in FIGS. 5C and 5F (the hBN spacers are required to control the lifetime of the charge carriers inside of the QW to allow efficient radiative recombination). The stacks were constructed via a multiple 'peel/lift' procedure making use of the van der Waals interaction between neighbouring crystals. The high quality of the samples is confirmed by cross-sectional TEM measurements, see FIG. 5D, which demonstrate the absence of contamination between the layers.

By applying bias voltage, $V_b$, between the two graphene electrodes, it is possible to set their Fermi levels in such a way that electron (hole) injection into the conductance (valence) band of TMDC QW occurs, see FIG. 5E. If the dwell time of the quasiparticles in the QW is long enough (controlled by the thickness of hBN) then they can form excitons and recombine with light emission, as shown in FIG. 5F.

FIG. 6A shows PL and EL for one of our WSe$_2$-based samples. It clearly shows 3 peaks for near-zero $V_b$, which we identify, as neutral exciton X-~1.72 eV, charged exciton X$^-$-~1.70 eV, and localised exciton at ~1.67 eV. The amplitude of the peaks depends in a complex way on the $V_b$, but the general trend is the decrease of the PL intensity with applied bias.

At I $V_b$|>2V the luminescence is dominated by EL signal. Typically, in most of the$_{[sH2]}$ samples, the EL signal at sufficiently high $V_b$ is dominated by X$^-$ peak, which shifts to lower energy with bias. Most interesting, however, is the temperature behaviour of the EL.

Figure 7:
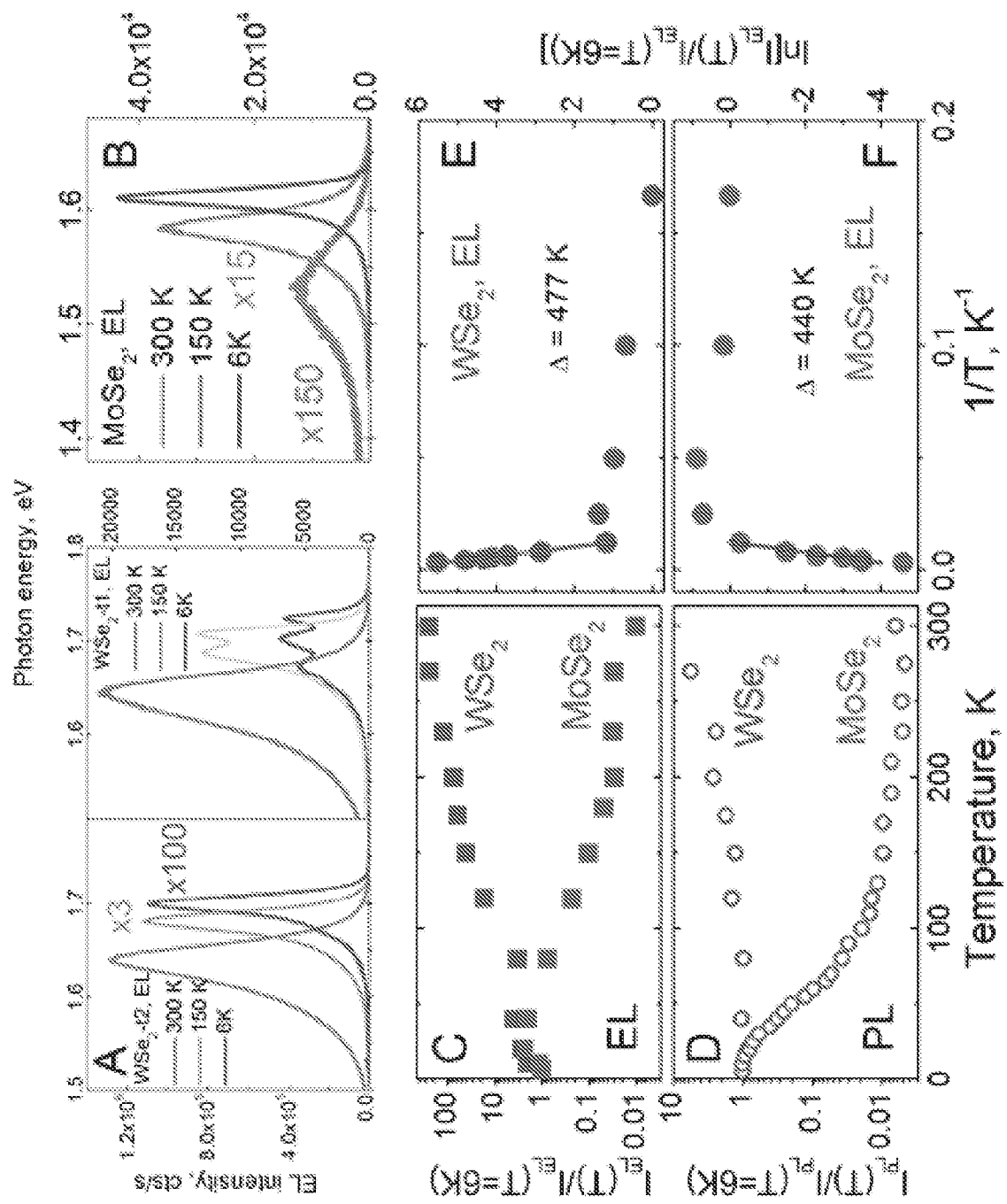
FIG. 7 shows (A) current density of j=(D) Ratio of the integrated electroluminescence intensity from T=6 K to T=300 K.

We have found that there is a growth in EL$_{[SH3]}$ by a factor of 300 from helium to room temperature as is shown in FIGS. 7A and 7C. With temperature, all three peaks usually merge into one, with X$^-$ probably dominating. We have found that similar behaviour is observed in LEDs based on WS$_2$ QW. The strong increase of the EL at room temperature gives rise to a large room temperature external quantum efficiency, which can reach 20% or more in some of our samples. This makes W-containing TMDCs very promising materials for future thin film, transparent and flexible LEDs.

Such behaviour is observed also in our LEDs based on WS$_2$. At the same time, LEDs based on Mo-containing TMDCs (see FIGS. 7B, 7C, and 7D) demonstrate a strong decrease of the EL with temperature. Thus, we suggest that the mechanism for the unusual T-dependence of EL in W-based LEDs probably lies in the specific band-structure of W-containing TMDCs.

We measured the activation temperature of EL for LEDs based on Mo- and W-containing TMDCs, as is shown in FIGS. 7E and 7F. The results are strikingly different, with the intensity of EL increasing exponentially with T for W-based LED and decreasing for Mo-containing LEDs. The extracted activation temperature for W-based LEDs is of the order of 30 meV.

Figure 8:
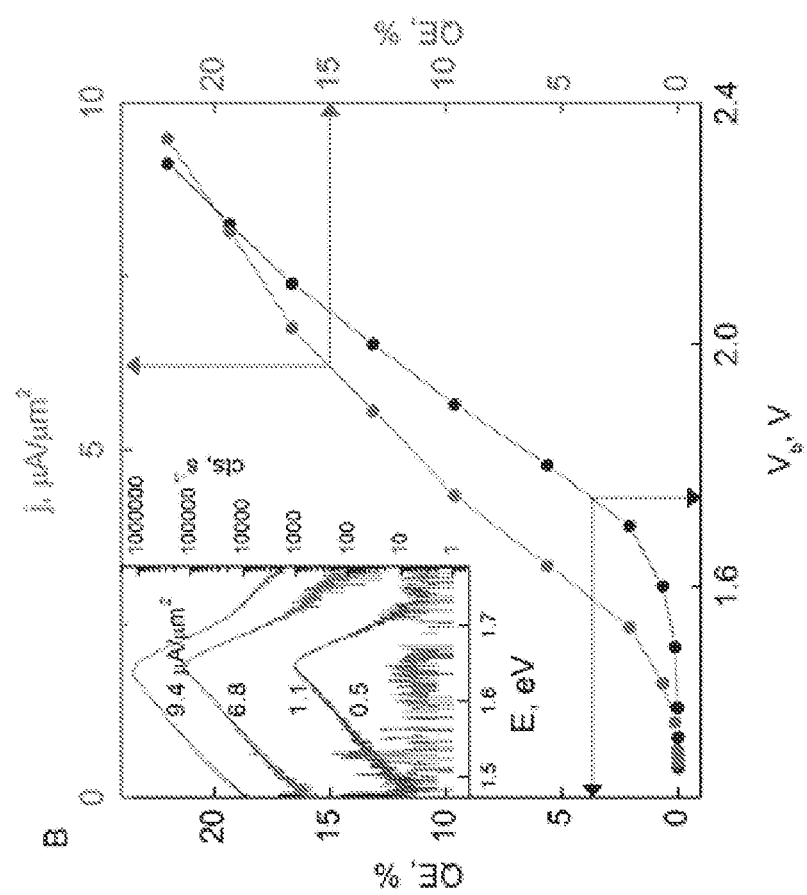
FIG. 8 shows (A) Temperature dependence of the quantum efficiency for 6 separate WSe$_2$ single quantum wells measured from T=6 K to T=300 K. (B) Room temperature bias dependence of the electroluminescence spectra measured from Vb=1.3V to 2.3V. (C) (Left/bottom axis) bias voltage dependence of the quantum efficiency (right/top axis) current density dependence of the quantum efficiency.
Figure 8:
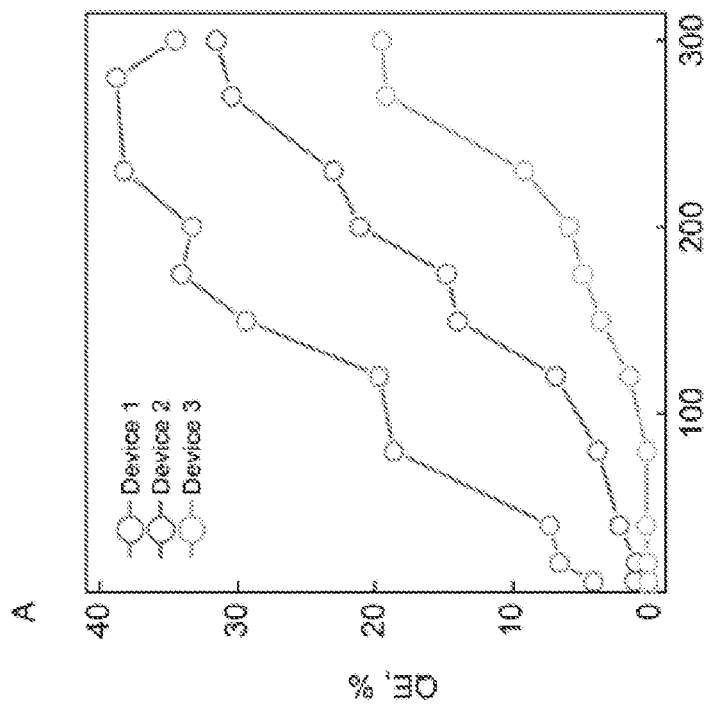

The exponential increase in EL with temperature opens very interesting opportunities for W-based TMDC to be used for LED applications. The most important parameter for such applications is the EQE. FIG. 8A shows typical behaviour of the EQE for three typical devices. The temperature dependence of the quantum efficiency, QE=2N/j of the WSe2 LEDs always shows the characteristic increase with temperature reaching nominal values of 10-20% for single QW LED's a factor 100 improvement as compared to MoX$_2$ based TMDC's.

Another interesting property is the persistent high quantum efficiency at high electric fields of ~10$^7$ Vcm$^{-1}$ and current density of order 1000 A/cm$^2$. A common disadvantage of commercial and domestic LED lighting is the droop effects at high injection current due to increased non-radiative scattering mechanisms and also heating effects which limit quantum efficiency. Our devices however get brighter at higher temperature and the efficiency remains high even at extremely high current densities. Improvements to crystal quality of the TMDC and reduction of graphene lead resistance could be expected to increase the quantum efficiency even further.

These heterostructures were produced as follows. Firstly, bulk hexagonal boron nitride hBN is mechanically cleaved and exfoliated onto a freshly cleaned Si/SiO$_2$ substrate. After this a graphene flake is peeled from a PMMA membrane onto the hBN crystal followed by a thin hBN tunnel barrier then a hBN tunnel barrier on PMMA is used to lift a WSe$_2$ or MoSe2 single layer from a second substrate then both of these crystals are together peeled off the PMMA onto the hBN/Gr/hBN stack forming hBN/Gr/hBN/WX2/hBN. Finally the top graphene electrode is peeled onto the stack thus completing the LED structure. After the stack is completed we either follow standard micro fabrication procedures for adding electrical contacts to the top and bottom graphene electrodes 'or' the whole stack is transferred onto highly reflective distributed Bragg reflector substrate where we are able to collect up to 30% of the emitted light from the LED opposed to just 2% from the Si/SiO$_2$ substrate.

It can thus be seen that the heterostructures of the present invention offer significant advantages in terms of electroluminescent efficiencies and/or quantum efficiencies and represent a potentially valuable materials for fabricating electronic devices.

The invention claimed is:
1. A graphene-based vertical heterostructure comprising at least the following layers in sequence:
   a first graphene layer comprising graphene or modified graphene;
   a first insulating layer;
   a first TMDC layer;
   a second insulating layer;
   a second TMDC layer;
   a third insulating layer; and
   a second graphene layer comprising graphene or modified graphene;
wherein the layers are stacked to form a laminate structure.
2. A heterostructure as claimed in claim 1, wherein at least one additional layer is present on a surface of the first graphene layer opposite the first insulating layer.
3. A heterostructure as claimed in claim 2, wherein the at least one additional layer is selected from the group consisting of hexagonal boron nitride (hBN), SiO$_2$ and Si.
4. A heterostructure as claimed in claim 1, wherein at least one additional layer is present on a surface of the second graphene layer opposite the third insulating layer.
5. A heterostructure as claimed in claim 1, wherein the heterostructure is mounted on a substrate.

6. A heterostructure as claimed in claim 1, wherein one or more component layers of the heterostructure is formed of a single crystal.

7. A heterostructure as claimed in claim 1, wherein the graphene of at least one of the first graphene layer and the second graphene layer is pristine graphene.

8. A heterostructure as claimed in claim 1, wherein the graphene of at least one of the first graphene layer and the second graphene layer is chemically modified graphene.

9. A heterostructure as claimed in claim 1, wherein the TMDC is selected from the group consisting of: $MoS_2$, $WS_2$, $WSe_2$, $MoSe_2$, $MoTe_2$, and $WTe_2$.

10. A heterostructure as claimed in claim 1 wherein at least one insulating layer comprises hBN.

11. A heterostructure as claimed in claim 1 wherein each insulating layer comprises hBN.

12. A heterostructure as claimed in claim 1 wherein at least one insulating layer consists essentially of hBN.

13. A heterostructure as claimed in claim 1 wherein each insulating layer consists essentially of hBN.

14. A graphene-based vertical heterostructure comprising at least the following layers in sequence:
 a first graphene layer comprising graphene or modified graphene;
 a first insulating layer;
 a first TMDC layer;
 a second insulating layer;
 a second TMDC layer;
 a third insulating layer;
 a third TMDC layer;
 a fourth insulating layer; and
 the second graphene layer comprising graphene or modified graphene;
 wherein the layers are stacked to form a laminate structure.

15. A graphene-based vertical heterostructure comprising at least the following layers in sequence:
 a first graphene layer comprising graphene or modified graphene;
 a first insulating layer;
 a first TMDC layer;
 a second insulating layer;
 a second TMDC layer;
 a third insulating layer;
 a third TMDC layer;
 a fourth insulating layer;
 a fourth TMDC layer;
 a fifth insulating layer; and
 a second graphene layer comprising graphene or modified graphene;
 wherein the layers are stacked to form a laminate structure.

16. A graphene-based vertical heterostructure comprising at least the following layers in sequence:
 a first graphene layer comprising graphene or modified graphene;
 a first insulating layer;
 a first TMDC layer;
 a second insulating layer;
 a second TMDC layer;
 a third insulating layer;
 a third TMDC layer;
 a fourth insulating layer;
 a fourth TMDC layer;
 a fifth insulating layer;
 a fifth TMDC layer;
 a sixth insulating layer; and
 a second graphene layer comprising graphene or modified graphene;
 wherein the layers are stacked to form a laminate structure.

* * * * *